US012205663B2

(12) United States Patent
Ngueya Wandji et al.

(10) Patent No.: US 12,205,663 B2
(45) Date of Patent: Jan. 21, 2025

(54) REGULATED NEGATIVE CHARGE PUMP CIRCUITRY AND METHODS

(71) Applicant: Arm Limited, Cambridge (GB)

(72) Inventors: Steve Ngueya Wandji, Nice (FR); El Mehdi Boujamaa, Valbonne (FR); Cyrille Nicolas Dray, Antibes (FR)

(73) Assignee: Arm Limited, Cambridge (GB)

( * ) Notice: Subject to any disclaimer, the term of this patent is extended or adjusted under 35 U.S.C. 154(b) by 34 days.

(21) Appl. No.: 16/506,662

(22) Filed: Jul. 9, 2019

(65) Prior Publication Data
US 2021/0012814 A1   Jan. 14, 2021

(51) Int. Cl.
G11C 5/14    (2006.01)
G11C 11/16   (2006.01)
H02M 3/07    (2006.01)

(52) U.S. Cl.
CPC .......... *G11C 5/145* (2013.01); *G11C 11/1697* (2013.01); *H02M 3/07* (2013.01); *H02M 3/071* (2021.05)

(58) Field of Classification Search
CPC .............. G11C 11/1697; G11C 11/161; G11C 11/1659; G11C 11/1673; G11C 11/1675; G11C 11/1677; G11C 11/1693; G11C 11/1695; G11C 11/165; G11C 11/1653; G11C 11/1655; G11C 11/1657; G11C 5/145; G11C 5/146; H02M 2003/071
See application file for complete search history.

(56) References Cited

U.S. PATENT DOCUMENTS

| | | | | |
|---|---|---|---|---|
| 5,347,172 A * | 9/1994 | Cordoba | ................ | G05F 1/465 327/536 |
| 5,553,295 A * | 9/1996 | Pantelakis | ............... | H02M 3/07 363/60 |
| 5,694,072 A * | 12/1997 | Hsiao | ...................... | G05F 3/205 327/536 |
| 6,246,280 B1 * | 6/2001 | Morishita | ............. | G11C 5/146 327/535 |
| 9,613,712 B1 * | 4/2017 | Disegni | .................. | G11C 16/06 |
| 10,135,333 B1 * | 11/2018 | Truong | ................ | H03K 17/063 |
| 2003/0197546 A1 * | 10/2003 | Sim | ........................ | G11C 16/30 327/534 |
| 2006/0103434 A1 * | 5/2006 | Okamoto | ............... | G11C 5/145 327/77 |
| 2010/0172173 A1 * | 7/2010 | Abu-Rahma | ....... | G11C 11/1659 365/158 |
| 2012/0133415 A1 * | 5/2012 | Oh | .................... | H03K 3/356182 327/333 |
| 2017/0230041 A1 * | 8/2017 | Kato | ...................... | H01L 21/78 |
| 2018/0004281 A1 * | 1/2018 | Kang | ..................... | G11C 5/147 |

* cited by examiner

*Primary Examiner* — Patrick C Chen
(74) *Attorney, Agent, or Firm* — Pramudji Law Group PLLC; Ari Pramudji (57) ABSTRACT

In a particular implementation, a circuit comprises: a first branch comprising a first transistor, where the first branch is configured to generate a first voltage; a second branch comprising a second transistor, where the second branch is configured to generate a second voltage; and a comparator configured to generate an output signal based on a comparison of the first and second voltages. Also, the output signal may be configured to regulate an output voltage of one or more negative charge pump circuits coupled to the circuit.

23 Claims, 10 Drawing Sheets

610 — Convert, by a voltage regulator circuit, a negative voltage output from one or more negative charge pump core circuits to a first voltage in the voltage regulator circuit 620 — Compute, by a comparator in the voltage regulator circuit, a voltage comparison of the first voltage and a second voltage, where an output value of the comparator corresponds to the negative voltage output of the the one or more negative charge pump circuits.

REGULATED NEGATIVE CHARGE PUMP CIRCUITRY AND METHODS

I. FIELD

The present disclosure is generally related to negative charge pump voltage regulator circuitry and methods for voltage regulation and reference voltage generation.

II. DESCRIPTION OF RELATED ART

The growing market of internet of things (IoT) require energy efficient circuits. These devices, in order to interact with their environment, use an embedded nonvolatile memory (NVM) for data storage and code execution. Magnetic random-access memory (MRAM) is one NVM solution adopted due to its low power consumption and high speed.

Unlike conventional random-access memory (RAM) chip technologies, in MRAM, data is not stored as electric charge but is instead stored by magnetic polarization of storage elements. The storage elements are formed from two ferromagnetic layers separated by a tunneling layer. One of the two ferromagnetic layers that is referred to as the fixed layer or pinned layer has a magnetization that is fixed in a particular direction. The other ferromagnetic magnetic layer that is referred to as the free layer has a magnetization direction that can be altered to represent either a "1" when the free layer magnetization is anti-parallel to the fixed layer magnetization or "0" when the free layer magnetization is parallel to the fixed layer magnetization or vice versa. One such device having a fixed layer, a tunneling layer, and a free layer is a magnetic tunnel junction (MTJ). The electrical resistance of an MTJ depends on whether the free layer magnetization and fixed layer magnetization are parallel or anti-parallel with each other. A memory device such as MRAM is built from an array of individually addressable MTJs.

To read data in a conventional MRAM, a read-current flows through the MTJ via the same current path used to write data in the MTJ. If the magnetizations of the MTJ's free layer and fixed layer are oriented parallel to each other, the MTJ presents a resistance that is different than the resistance the MTJ would present if the magnetizations of the free layer and the fixed layer were in an anti-parallel orientation. In a conventional MRAM, two distinct states are defined by two different resistances of an MTJ in a bit-cell of the MRAM. The two different resistances represent a logic "0" and a logic "1" value stored by the MTJ.

To determine whether the MTJ of a particular bit-cell (of a row of MRAM bit-cells) represents a "0" or a "1", the current passing through the selected bit-cell (accessed bit) may be read by applying a voltage to the bit-cell. However, in doing so, two currents are generated: the desired read-current and a parasitic current (generated from the combination of the other unselected (un-accessed) bit-cell devices of the row) in parallel with the desired read-current. When such parasitic current is too "large" in comparison to the read-current, the parasitic current may "hide" the desired read-current such that there is no detectable read margin to distinguish between "0" and "1" (e.g., to determine a low resistance state (LRS) or high resistance state (HRS)) of the accessed bit. Accordingly, there is a need in the art to prevent ("cancel") the occurrence of such parasitic current so that the selected bit-cell may be properly read.

III. BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, circuits or apparatuses described herein.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

IV. DETAILED DESCRIPTION

According to one implementation of the present disclosure, a circuit is disclosed. In a particular implementation, the circuit comprises: a first branch comprising a first transistor, where the first branch is configured to generate a first voltage; a second branch comprising a second transistor, where the second branch is configured to generate a second voltage; and a comparator configured to generate an output signal based on a comparison of the first and second voltages. Also, the output signal may be configured to regulate an output voltage of one or more negative charge pump circuits coupled to the circuit.

According to another implementation of the present disclosure, a method for converting negative voltages to positive voltages for voltage comparison and for generating a low power reference element is disclosed. For example, the method includes: 1) converting, by a voltage regulator circuit, a negative voltage output from one or more negative charge pump core circuits to a first voltage in the voltage regulator circuit; and 2) computing, by a comparator in the voltage regulator circuit, a voltage comparison of the first voltage and a second voltage. Also, the output value of the comparator may correspond to the negative voltage output of the one or more negative charge pump circuits.

According to another implementation of the present disclosure, a system is disclosed. The system includes: 1) a control block circuitry comprising a voltage regulator circuit, a reference current generation circuit, a direct current (DC) compensation circuit, and a ring oscillator circuit; and 2) a plurality of word-line driver decoding blocks comprising respective negative charge pump (NCP) circuits. Also, an output of the respective NCP circuits may be coupled to a common node.

According to another implementation of the present disclosure, a system is disclosed. The system includes: a voltage regulator circuit; one or more negative charge pump (NCP) circuits; and a direct current (DC) compensation circuit. In a certain implementation, an output voltage of the voltage regulator circuit may be coupled to one input of the DC compensation circuit. Also, an output voltage of the DC compensation circuit and an output voltage of the one or more negative charge pump (NCP) circuits may be coupled to a common voltage node. Moreover, the output voltage of the DC compensation circuit may be configured to prevent voltage drift.

Particular implementations of the present disclosure are described below with reference to the drawings. In the description, common features are designated by common reference numbers throughout the drawings.

In an example bit-cell, leakage current can be approximated by the subthreshold leakage current $I_{SUB}$:

$$I_{SUB} \propto I_0 e^{\left(\frac{V_G - V_S - V_{TH}}{nkT/q}\right)}.$$

In the above equation, $I_0$ represents a subthreshold saturation current; $V_G$ represents the word-line (WL) voltage; Vs is the source-line (SL) voltage; $V_{TH}$ represents the threshold voltage of an unselected access device (of a memory bit-cell); k represents the Boltzmann constant; T represents the temperature; q represents the charge of an electron; and n is a correlation factor (where 1<n<2). As seen, when the overdrive voltage ($V_{GS}$-$V_{TH}$) can be a constant, the leakage current of one cell increases with respect to temperature. Accordingly, the total leakage would increase not only with respect to temperature, but also with respect to the quantity of memory bit-cells. Hence, the greater the number of bit-cells, the greater the amount of current leakage.

For instance, at low power applications, the read-current can be very low (e.g., 1 μA-2 μA). At hot temperatures (e.g., temperatures>105° C.) and for a large number of memory bit-cells, the total current leakage may be in the order of a few μAs, and so, the current leakage (i.e., $I_{LEAK}$, the sum of currents through all the unselected devices when the unselected devices have their WLs grounded) could be greater than the desired read-current (i.e., $I_{BIT}$, the current through a selected device). Hence, there can be a reduction in a read margin and an increase in read failure at high sigma. To overcome this concern, the overdrive voltage ($V_{GS}$-$V_{TH}$) should be less than zero (e.g., the overdrive voltage<<0) in order to minimize the impact of the exponential term in the subthreshold leakage expression.

Figure 1:
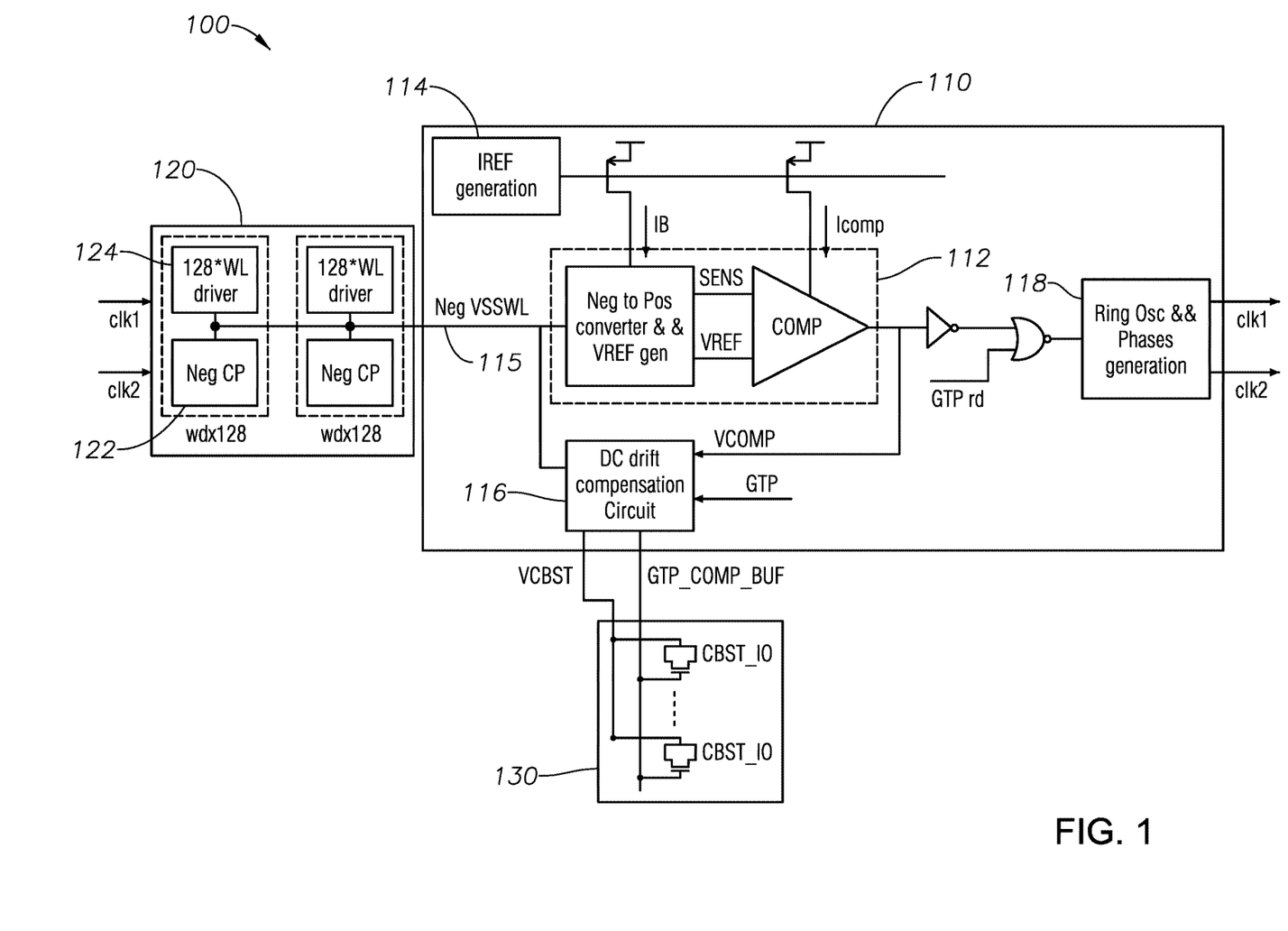
FIG. 1 is a schematic diagram of a system in accordance with various implementations described herein.
Figure 2:
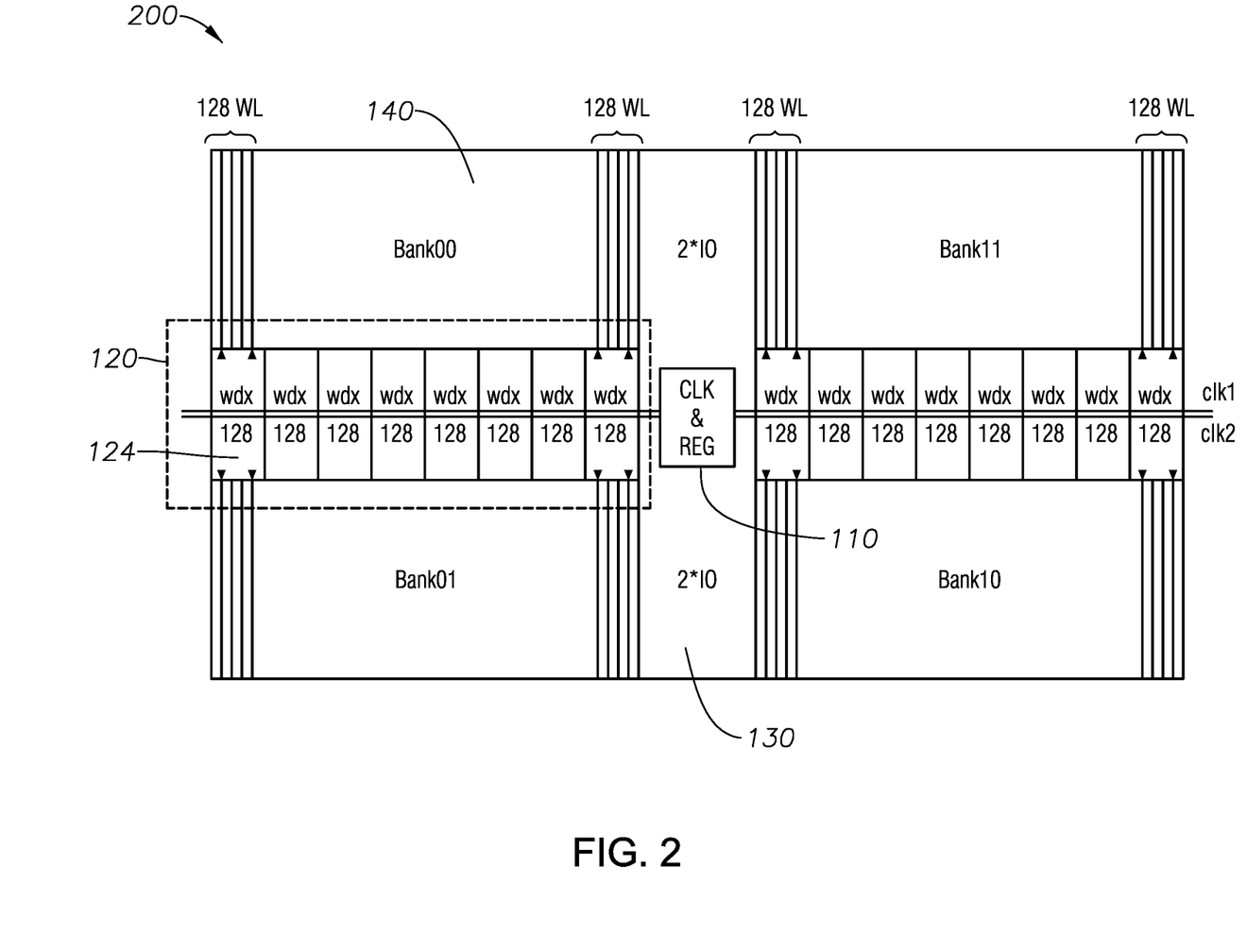
FIG. 2 is a schematic diagram of a system in accordance with various implementations described herein.

Advantageously, to allow for proper read operations, aspects of the present disclosure provide solutions to minimize and compensate for parasitic current (i.e., leakage current) in any type of memory bit-cells (e.g., an MRAM, etc.). For instance, in certain example implementations (as described herein), a negative voltage (i.e., generated negative voltage, negative output voltage) may be applied to gates of access devices in respective memory bit-cells (e.g., charge injections during WL deselection). To do so, one or more negative charge pumps (NCPs) (i.e., negative charge pump circuits as described with reference with FIGS. 1 and 7-9) may be implemented in the memory organization circuit block arrangement (as shown in FIGS. 1 and 2). Correspondingly, such generated negative voltage should be as stable as possible to avoid "ripples" on the unselected WLs.

As another advantage, the present disclosure provides for a distributed architecture for the one or more negative charge pumps (NCPs). A minimally-sized NCP core can be implemented inside each WL decoding block (i.e., WDX128). For instance, as shown with reference to FIGS. 1 and 7-9, a minimally-sized NCP core can drive all of the WL drivers of each WL decoding block. Moreover, the output of all of the minimally-sized NCP cores can be connected together to a common node (e.g., having the generated negative voltage, Neg. $V_{SSWL}$). As a result, the total load connected to the node (having the generated negative voltage) may allow for scalability with respect to greater quantities of connected word-lines.

In addition, the present disclosure also provides for a compensation circuit (as described with reference to FIG. 10) that can be implemented to avoid the drift of negative voltage (Neg. $V_{SSWL}$) to positive voltages based on WL switching activities, leakage through the WL drivers, or any noise in the overall circuit arrangement. Moreover, the present disclosure includes a compensation circuit that is based on a distributed capacitor inside each input/output (IO) block circuity. Advantageously, the value of the distributed capacitor can be the same order of magnitude as that of the total capacitor on a WL. Accordingly, the overall regulated negative charge pump system may provide the generation of a negative voltage at a required level regardless of the size of the memory.

Figure 3:
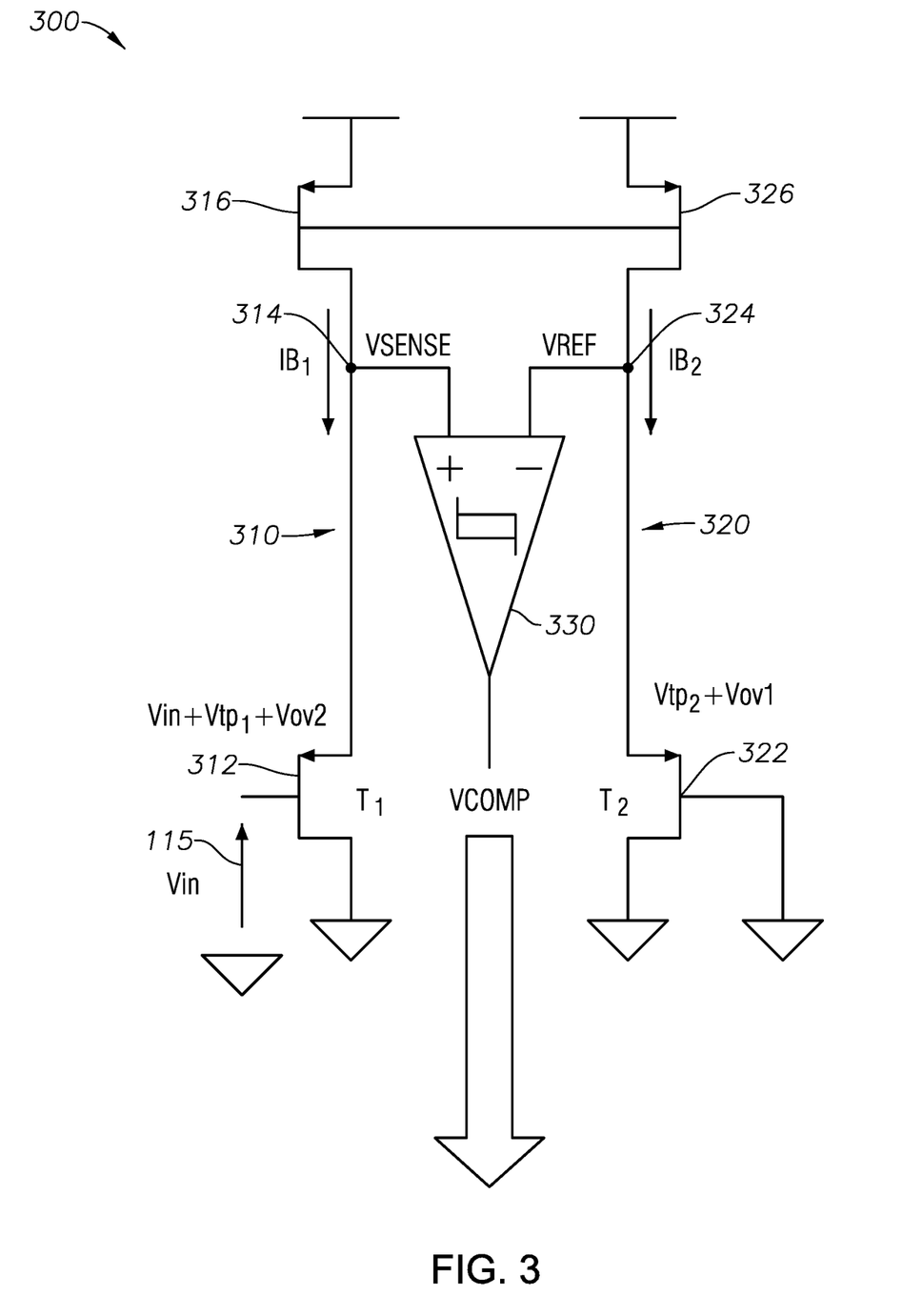
FIG. 3 is a schematic diagram of voltage regulator circuitry in accordance with various implementations described herein.
Figure 4:
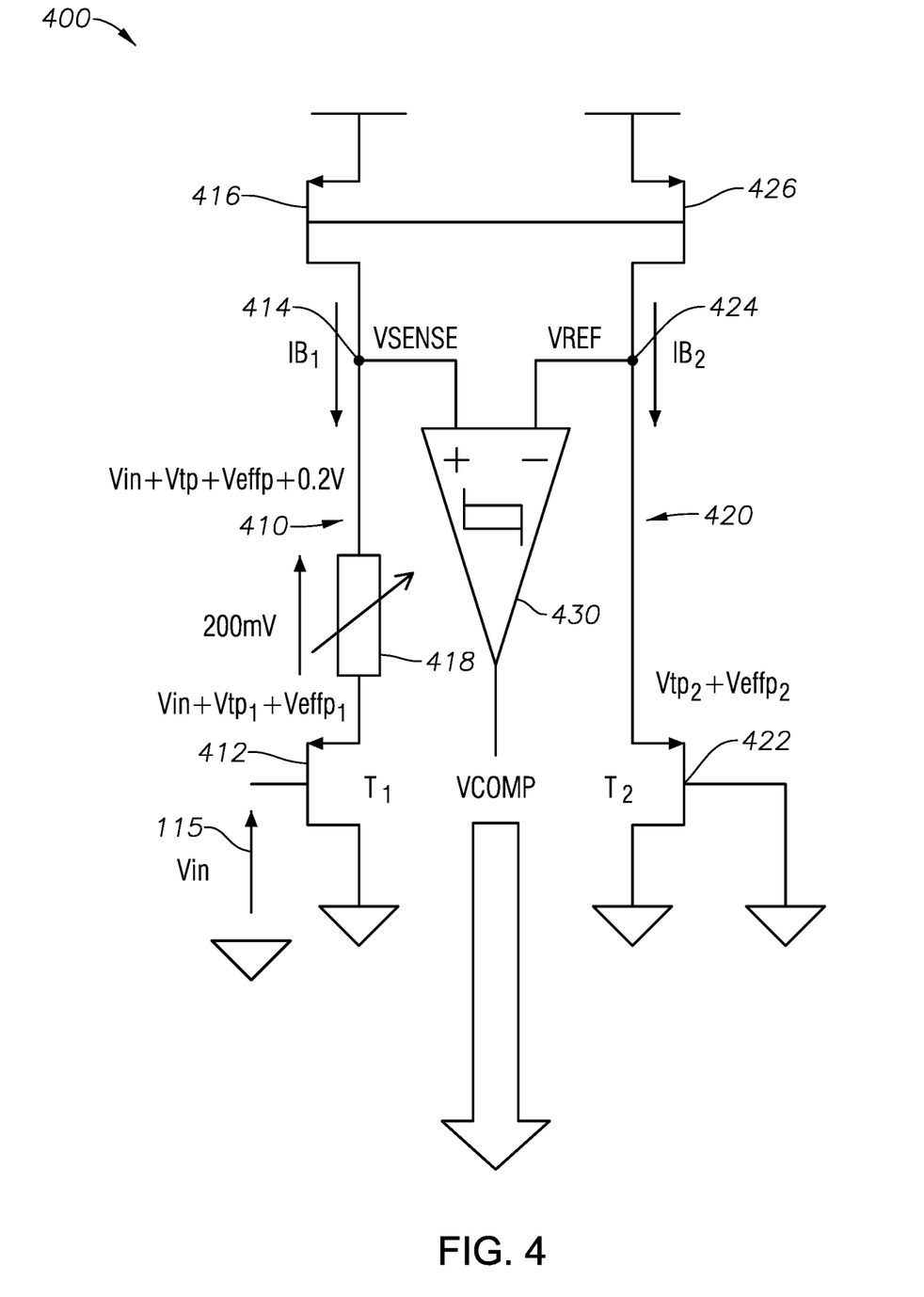
FIG. 4 is a schematic diagram of voltage regulator circuitry in accordance with various implementations described herein.
Figure 5:
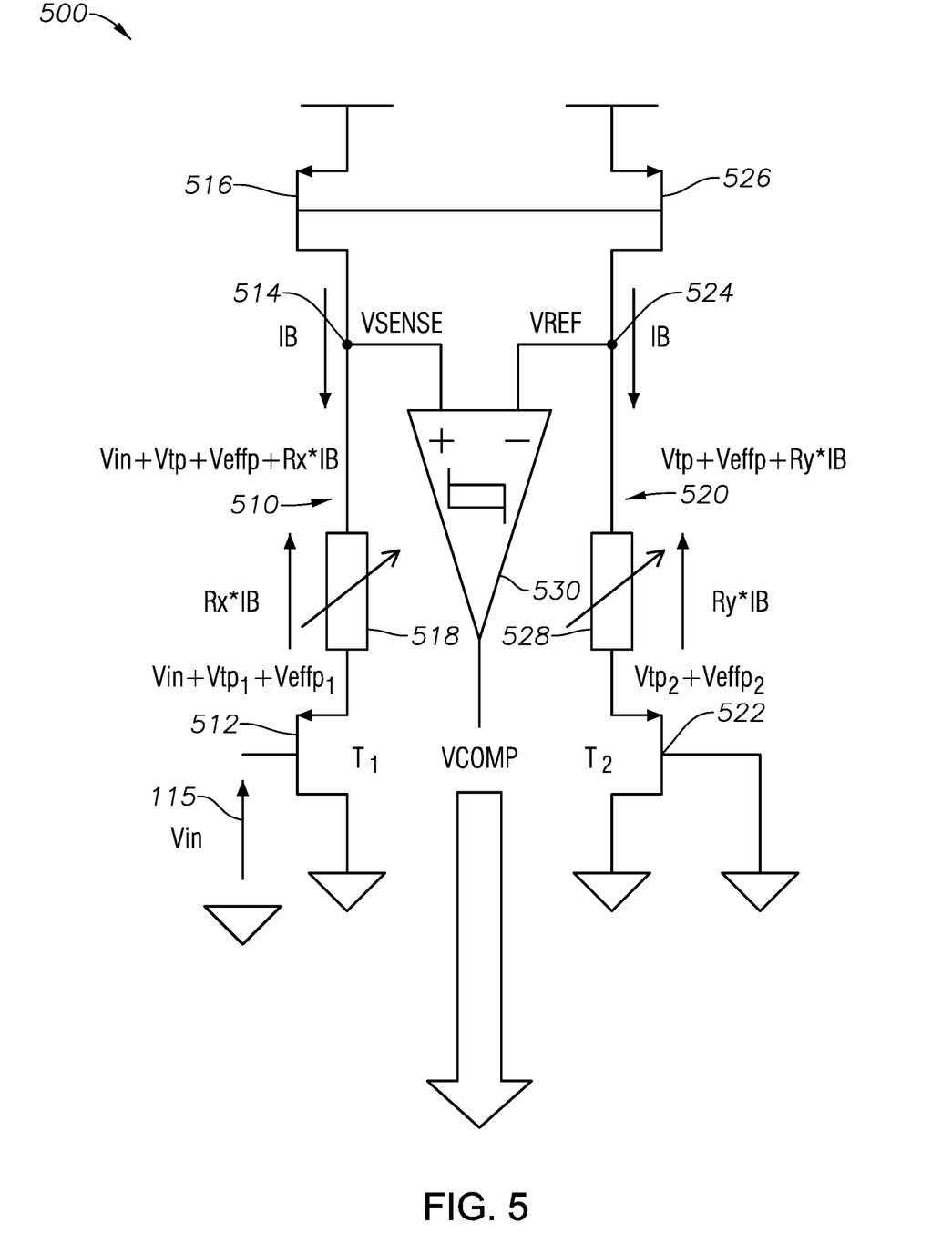
FIG. 5 is a schematic diagram of voltage regulator circuitry in accordance with various implementations described herein.

In certain aspects, the generated negative output voltage of the circuit arrangement may depend on the output load of the circuit block arrangement 100. Advantageously, a voltage regulator (e.g., voltage regulators 300, 400, 500) can be used to ensure a stable negative output voltage. In various implementations, the voltage regulation would occur in a closed-loop system based on the sensing of the negative voltage followed by a comparison between the sensed voltage and a reference voltage. Advantageously, according to particular aspects, various implementations of the voltage regulator circuits include low power reference generation schemes as well as low power sensing methods. In various examples, such implementations allow for minimal circuit area occupation as well as greater speed in response time.

Referring to FIGS. 1 and 2, schematic diagrams of a circuit block arrangement 100 (i.e., system, memory organization, an array) (e.g., an MRAM architecture, an MRAM compiler) are shown in different representations. As illustrated in FIG. 1, the circuit block arrangement 100 may include a control block 110 (i.e., control block and clock generation circuitry), a plurality of word-line driver decoding blocks 120, and a plurality of input/output (I/O) circuits 130. In certain implementations, the control block 110 may include a voltage regulator circuit 112 (e.g., as described in greater in detail with respect to FIGS. 3 and 4), a reference current generation circuit 114 (i.e., $I_{REF}$ generation circuit, Proportional-to-absolute-temperature/Complementary to absolute temperature (PTAT/CTAT) current generator circuit), a direct current (DC) compensation circuit 116, and a ring oscillator circuit 118 (i.e., a ring oscillator circuit and phases generation circuit). Also, as shown in FIGS. 1 and 2, the plurality of word-line driver decoding blocks 120 may include respective negative charge pump core circuits (i.e., negative charge pumps, NCPs) 122 for each respective word-line driver decoding block 124. As illustrated in FIG. 1, the circuit block arrangement 100 (and specifically the voltage regulator circuit 112) can be configured to regulate a negative voltage 115 (i.e., negative $V_{SSWL}$, generated negative voltage, charge injection during WL deselection) for transference to the plurality of word-line driver decoding blocks 120. As an example, upon receiving the generated negative voltage 115, each of the NCP circuits 122 can be configured to drive respective word-line driver blocks 124 (i.e., 128*WL drives). In such an example, each of pluralities of separate 128 word-lines are coupled to respective access devices of separate memory bit-cells located in memory banks 140 (e.g., memory banks 00, 01, 11, and 10) (as shown in FIG. 2).

Referring to FIG. 3, a schematic diagram of the voltage regulator circuit 112 (as described as voltage regulator circuit 300) (i.e., reference voltage generator/voltage comparator circuit, a control circuit, a conversion circuit, closed-loop feedback circuit, voltage-level detection circuit) is shown. As depicted, the example circuit 300 includes a first circuit branch 310 (i.e., first branch), a second circuit branch 320 (i.e., second branch), and a comparator 330. In certain implementations, the first and second branches 310, 320 may be configured to generate first and second voltages ($V_{SENSE}$, $V_{REF}$), respectively. Also, the comparator 330 may be configured to generate an output signal ($V_{COMP}$) (i.e., an output value, output metric, a control bit of the NCPs) based on a comparison of the first and second voltages ($V_{SENSE}$, $V_{REF}$). Moreover, the output signal ($V_{COMP}$) (i.e., output value, output metric, control bit of an NCP) can be configured to regulate an output voltage of one or more negative charge pump (NCP) circuits 122 (as shown in FIGS. 1 and 2) that is coupled to the voltage regulator circuit 300. In operation, the voltage regulator circuit 300 may be configured to provide control (regulation, stability) of the output voltage of the one or more NCP circuits 122 such that this output voltage 115 can minimize and compensate for leakage current in memory bit-cells.

In some implementations, the first circuit branch 310 may include a first transistor (T1) 312 (i.e., a first p-channel metal-oxide-semiconductor field effect transistor (PMOS) device), and the second circuit branch 310 may include a second transistor 322 (T2) (i.e., a second PMOS device). Also, the comparator 130 can be coupled between the first and second branches 310, 320, where the respective first and second voltage inputs of the comparator (i.e., first and second voltages ($V_{SENSE}$, $V_{REF}$)) are voltages at first and second nodes 314, 324 (i.e., voltage outputs) of the first and second branches 310, 320. Moreover, the output signal ($V_{COMP}$) can be coupled to the first branch 310 as a negative input voltage of the circuit 300. Hence, the voltage regulation in the circuit 300 can include a closed-loop system based on a "sensing" of the negative voltage 115, and further, provide a comparison between the sensed voltage (of the first branch 310) and a reference voltage (of the second branch 320).

In some instances, each of the first and second branches 310, 320 include an additional transistor device (i.e., third and fourth transistor devices (316, 326)) that can be configured to serve as current sources (i.e., first and second current sources). As shown in FIG. 3, gate terminals of the third and fourth transistor devices 316, 326 may be coupled to one another, while source terminals of the third and fourth transistor devices 316, 326 may be coupled in series with respective first and second transistor devices 312, 322. Also, in certain cases, assuming negligible mismatch between the devices, because such devices can be configured to have substantially identical gate-to-source voltage, the devices 316, 326 can generate substantially the same current (e.g., the respective first and second bias currents ($IB_1$, $IB_2$) would be substantially equal). (As shown in FIG. 1, the first and second bias currents ($IB_1$, $IB_2$) can originate from the $I_{REF}$ generation circuit 114.)

In one example operation, the third and fourth transistor devices 316, 326 are configured to transmit respective first and second bias currents ($IB_1$, $IB_2$) on the respective first and second branches 310, 320. The first circuit branch 310 can be configured to generate the first voltage ($V_{SENSE}$) in response to the first bias current ($IB_1$) biasing the first transistor 312, and the second circuit branch 320 is configured to generate the second voltage ($V_{REF}$) in response to the second bias current ($IB_2$) biasing the second transistor 322. Furthermore, in such an operation, the first and second bias currents ($IB_1$, $IB_2$) would not go into the negative charge pumps 122 (i.e., the bias currents do not "load" the NCPs). Accordingly, the one or more NCPs 122 would not need to compensate for extra "current loading", and thus, the circuit 300 (and the system 100) may consume the least amount of power possible. Accordingly, and advantageously, upon completion, the circuit 300 (and the system 100) can allow for low power charge pump operation.

In a particular implementation (where the first and second transistors 312, 322 may be different sizes), with reference to FIG. 3, in response to the biasing of the first transistor 312, the first transistor 312 can be configured to "level shift-up" (i.e., a first voltage shift, transfer to a different voltage level) voltage on the first branch 310 (e.g., on a first node 314 on the first branch 310) based on an input voltage ($V_{in}$) 115 (e.g., the output voltage of the one or more NCPs 122, the gate voltage of the first transistor 312), a first threshold voltage ($V_{TP1}$), and a first overdrive voltage ($V_{ov1}$, $V_{eff1}$) (e.g., the effective voltage of the first transistor device 312). Furthermore, in response to the biasing of the second transistor 322, the second transistor 322 can be configured to level shift-up voltage (i.e., a second voltage shift) (by a different voltage quantity than the first voltage shift) on the second branch (e.g., on a second node 324 on the second branch 320) based on a second threshold voltage ($V_{TP2}$) and a second overdrive voltage ($V_{ov2}$, $V_{eff2}$) (e.g., the effective voltage of the of the second transistor device 322). Moreover, in such an implementation, as the first and second transistor devices 312, 322 are different sizes, the first and second overdrive voltages would be different values. Hence, at the voltage at the first node 314, $V_{SENSE}$ (i.e., the first voltage), corresponds to $V_{in}+V_{TP1}+V_{ov1}$, while the voltage at the second node 324, $V_{REF}$ (i.e., the second voltage), corresponds to $V_{TP2}+V_{ov2}$. Next, at the comparator 330, a comparison of the first and second voltages ($V_{SENSE}$, $V_{REF}$) is performed.

In one case, if $V_{SENSE}$ is a greater than $V_{REF}$ (e.g., when $V_{in} > V_{ov2} - V_{ov1}$), the output of the comparator ($V_{COMP}$) 330 corresponds to a first value (e.g., either a digital "1" or "0"), and the example one or more NCP circuits 122 would be configured to decrease voltage ("pump down") and the ring oscillator 118 (as shown in FIG. 1) would be configured to be enabled. Alternatively, in another case, if $V_{SENSE}$ is less than $V_{REF}$ (e.g., when $V_{in} < V_{ov2} - V_{ov1}$), the output of the comparator 330 ($V_{COMP}$) corresponds to a second value (e.g., either a digital "0" or "1"), the one or more NCPs 122 can be configured to stop (i.e., output a zero voltage) and the ring oscillator 118 (as shown in FIG. 1) would be configured to be disabled. This would be because the voltage regulator circuit 300 would have reached the regulated voltage level required to compensate for leakage current (i.e., at the equilibrium/target voltage level). As an example, the regulated voltage level (i.e., the output voltage) of the one or more NCPs 122 can be configured to be −200 mV. In such an example, this output voltage would be transmitted to each unselected word-line of a respective bit-cell to reduce current leakage. Also, in such an example, the difference between the first voltage and the second voltage (i.e., the differential voltage) would be substantially equal to the input voltage of the circuit 300 ($V_{SENSE} - V_{REF} = V_{in}$) (as there would be no differential in threshold voltage (i.e., $V_{TP1} - V_{TP2} = 0$ and the bias currents ($IB_1$, $IB_2$) would not flow towards $V_{in}$). Moreover, in the implementation, the difference between the first and second overdrive voltages ($V_{ov2} - V_{ov1}$) would correspond to a voltage regulation range of the plurality of negative charge pump (NCP) circuits 122. Correspondingly, at the target voltage level, the input voltage ($V_{in}$) would be substantially equal to the difference between the first and second overdrive voltages ($V_{ov2} - V_{ov1}$).

Referring to FIG. 4, a schematic diagram of the voltage regulator circuit 112 (as described as voltage regulator circuit 400) (i.e., reference voltage generator/voltage comparator circuit, a control circuit, a conversion circuit, closed-loop feedback circuit, voltage-level detection circuit) is shown. As depicted, the example circuit 400 may be substantially identical to the circuit 300, with the exception that the first branch 410 may also include a voltage offset element 418 (i.e., voltage drop element) (e.g., resistor, transistor, etc.). In certain implementations, the voltage offset element 418 may be configured to generate an offset voltage to "shift down" the first voltage ($V_{SENSE}$) to provide control of the output voltage (i.e., Neg. $V_{SSWL}$) of the one or more NCP circuits 112. In operation, the voltage regulator circuit 400 may be configured to provide control (regulation, stability) of the output voltage of the one or more NCP circuits 122 such that this output voltage 115 can minimize and compensate for leakage current in memory bit-cells. Moreover, as another advantage, the circuit 400 may be process, voltage, and temperature (PVT) independent.

In an example operation, the first and second transistor devices 412, 422 are configured to transmit respective first and second bias currents ($IB_1$, $IB_2$) on the respective first and second branches 410, 420. The first circuit branch 410 can be configured to generate the first voltage ($V_{SENSE}$) in response to the first bias current ($IB_1$) biasing the first transistor 412, and the second circuit branch 420 is configured to generate the second voltage ($V_{REF}$) in response to the second bias current ($IB_2$) biasing the second transistor 422. Furthermore, in such an operation, the first and second bias currents ($IB_1$, $IB_2$) would not go into the negative charge pumps 122 (i.e., the bias currents do not "load" the NCPs). Accordingly, the one or more NCPs 122 would not need to compensate for extra "current loading", and thus, the circuit 400 (and the system 100) may consume the least amount of power possible. Accordingly, and advantageously, upon completion, the circuit 400 (and the system 100) can allow for low power charge pump operation.

In a particular implementation (where the first and second transistors 412, 422 may be substantially identical sizes), with reference to FIG. 4, in response to the biasing of the first transistor 412, the first transistor 412 can be configured to "level shift-up" (i.e., a first voltage shift) voltage on the first branch 410 based on an input voltage ($V_{in}$) 115 (e.g., the output voltage of the one or more NCPs 122, the gate voltage of the first transistor 412), a first threshold voltage ($V_{TP1}$), and a first overdrive voltage ($V_{eff1}$) (e.g., the effective voltage of the of the first transistor device 412). Accordingly, an intermediate voltage corresponding to $V_{in} + V_{TP1} + V_{eff1}$ can be generated. Next, as the first and second transistors 412, 422 are the substantially the same size in the particular implementation, both the first and second threshold voltages ($V_{TP1}$, $V_{TP2}$) and the first and second effective voltages ($V_{eff1}$, $V_{eff2}$) (i.e., first and second overdrive voltages) would be substantially identical ($V_{TF1} = V_{TP2}$) ($V_{eff1} = V_{eff2}$). Accordingly, the voltage-level shifters on both the first and the second branches 410, 420 would cancel out. Consequently, the voltage-drop across a voltage offset device 418 (Rx) on the first branch 410 (coupled between to the first transistor 412 and the first node 414) would generate an offset voltage (i.e., voltage drop, floating voltage). Accordingly, the first voltage ($V_{SENSE}$) of the circuit 400 may be generated based on a combination of the intermediate voltage and the generated offset voltage (e.g., 200 mV). In such an implementation, the voltage offset device (Rx) 418 may be configured to shift down the first voltage ($V_{SENSE}$). Moreover, the second voltage ($V_{REF}$) can be generated based on the first voltage shift (i.e., the level shift-up of the first transistor). Furthermore, in response to the biasing of the second transistor 422, the second transistor 422 can be configured to level shift-up voltage (i.e., the first voltage shift) on the second branch 420 (e.g., on a second node 424 on the second branch 420) based on a second threshold voltage ($V_{TP2}$) and a second overdrive voltage ($V_{eff2}$) (e.g., the effective voltage of the of the second transistor device 422. However, because the sizes of the first and second transistor 412, 422 are substantially identical, both the first and second threshold voltages ($V_{TP1}$, $V_{TP2}$) and the first and second effective voltages ($V_{eff1}$, $V_{eff2}$) would be substantially identical ($V_{TP1} = V_{TP2}$) ($V_{eff1} = V_{eff2}$). Accordingly, the second voltage (i.e., the reference voltage, $V_{REF}$) would correspond to $V_{TP2} + V_{eff2} + 0$ (i.e., the gate voltage of the second transistor 422), which would also equal $V_{TP1} + V_{eff1}$. Next, at the comparator 430, a comparison of the first and second voltages ($V_{SENSE}$, $V_{REF}$) is performed.

As an example, for the comparison of the first and second voltages ($V_{SENSE}$, $V_{REF}$), a "trip point" is the point where the output value of the comparator 430 would start to "flip" (switch) from "1 to a "0" or vice versa. In this instance, the trip point would be controlled by the second voltage, $V_{REF}$. Also, to reach the trip point, the first voltage has to be substantially equal the second voltage ($V_{SENSE} = V_{REF}$) (i.e., $V_{SENSE} - V_{REF} = 0$). Also, the circuit 400 would have to verify whether the difference between $V_{SENSE}$ and $V_{REF}$ is substantially equal to the combination of Vin and the voltage drop across the voltage offset device (Rx) 418 (e.g., $V_{SENSE} -$ $V_{REF}=V_{in}+0.2V$). Hence, for example, at the comparator 430 trip point, Vin=−0.2V. Thus, in this manner, a reference voltage may be constructed.

Accordingly, in one case, if $V_{SENSE}$ is a greater than $V_{REF}$ (e.g., when $V_{in}>-0.2V$), the output of the comparator ($V_{COMP}$) 430 corresponds to a first value (e.g., either a digital "1" or "0"), and the example one or more NCP circuits 122 would be configured to decrease voltage ("pump down") and the ring oscillator 118 (as shown in FIG. 1) would be configured to be enabled. Alternatively, in another case, if $V_{SENSE}$ is less than $V_{REF}$ (e.g., when $V_{in}<-0.2V$), the output of the comparator 430 ($V_{COMP}$) corresponds to a second value (e.g., either a digital "0" or "1"), the example one or more NCPs 122 can be configured to stop (i.e., output a zero voltage) and the ring oscillator 118 (as shown in FIG. 1) would be configured to be disabled. This would be because the voltage regulator circuit 400 would have reached the regulated voltage level required to compensate for leakage current (i.e., at the equilibrium voltage level). As discussed, the regulated voltage level (i.e., the output voltage) of the one or more NCPs 122 can be configured to be −200 mV. In such an example, this output voltage (i.e., Neg. $V_{SSWL}$) would be transmitted to each unselected word-line of a respective bit-cell to reduce current leakage.

In certain implementations, to ensure the correct value of $V_{SENSE}$, the voltage offset device 418 (Rx) should be trimmable. For example, the voltage offset device 418 can include three bits of for trimming. In one example, to target the negative output voltage 115 for −200 mV for a bias current (IB)=1 μA, the negative charge pump (NCP) TRIM is 100, the voltage offset device 418 is 200 kOhms, and the change in voltage (ΔV, change in voltage over the voltage drop element) (mV) is 200.

Referring to FIG. 5, a schematic diagram of the voltage regulator circuit 112 (as described as voltage regulator circuit 500) (i.e., reference voltage generator/voltage comparator circuit, a control circuit, a conversion circuit, closed-loop feedback circuit, voltage-level detection circuit) is shown. As depicted, the example circuit 500 may be substantially identical to the circuits 300 or 400, with the exception that the first and second branches 510, 520 may also include respective voltage offset elements 518, 528 (i.e., voltage drop element) (e.g., resistor, transistor, etc.). In certain implementations, the voltage offset elements 518, 528 may be configured to generate first and second offset voltages to "shift down" both the respective first and second voltages ($V_{SENSE}$ and $V_{REF}$). In doing so, the voltage regulator circuit can provide control of the output voltage (i.e., Neg. $V_{SSWL}$) of the one or more NCP circuits 112. In operation, the voltage regulator circuit 500 may be configured to provide control (regulation, stability) of the output voltage of the one or more NCP circuits 122 such that this output voltage 115 can minimize and compensate for leakage current in memory bit-cells. Moreover, as another advantage, the circuit 500 may be process, voltage, and temperature (PVT) independent.

Similar to as described with reference to FIG. 4, in an example operation, the first and second transistor devices 512, 522 are configured to transmit respective first and second bias currents ($IB_1$, $IB_2$) on the respective first and second branches 510, 520. The first circuit branch 510 can be configured to generate the first voltage ($V_{SENSE}$) in response to the first bias current ($IB_1$) biasing the first transistor 512, and the second circuit branch 520 is configured to generate the second voltage ($V_{REF}$) in response to the second bias current ($IB_2$) biasing the second transistor 522. Furthermore, in such an operation, the first and second bias currents ($IB_1$, $IB_2$) would not go into the one into the negative charge pumps 122 (i.e., the bias currents do not "load" the NCPs). Accordingly, the one or more NCPs 122 would not need to compensate for extra "current loading", and thus, the circuit 500 (and the system 100) may consume the least amount of power possible. Accordingly, and advantageously, upon completion, the circuit 500 (and the system 100) can allow for low power charge pump operation.

In a particular implementation (where the first and second transistors 512, 522 may be substantially identical sizes), with reference to FIG. 5, in response to the biasing of the first transistor 512, the first transistor 512 can be configured to "level shift-up" (i.e., a first voltage shift) voltage on the first branch 510 based on an input voltage ($V_{in}$) 115 (e.g., the output voltage of the one or more NCPs 122, the gate voltage of the first transistor 512), a first threshold voltage ($V_{TP1}$), and a first overdrive voltage ($V_{eff1}$) (e.g., the effective voltage of the of the first transistor device 512). Accordingly, on the first circuit branch 510, a first intermediate voltage corresponding to $V_{in}+V_{TP1}+V_{eff1}$ can be generated. Next, as the first and second transistors 512, 522 are the substantially the same size in this particular implementation, both the first and second threshold voltages ($V_{TP1}$, $V_{TP2}$) and the first and second effective voltages ($V_{eff1}$, $V_{eff2}$) (i.e., first and second overdrive voltages) would be substantially identical ($V_{TP1}=V_{TP2}$) ($V_{eff1}=V_{eff2}$). Accordingly, the voltage-level shifters on both the first and the second branches 510, 520 would cancel out. Consequently, the voltage-drop across a voltage offset device 518 (Rx) on the first branch 510 (coupled between to the first transistor 512 and the first node 514) would generate an offset voltage (i.e., voltage drop, floating voltage). Accordingly, the first voltage ($V_{SENSE}$) of the circuit 500 may be generated based on a combination of the first intermediate voltage and the generated first offset voltage.

Furthermore, in response to the biasing of the second transistor 522, the second transistor 522 can be configured to "level shift-up" (i.e., a second voltage shift) voltage on the second branch 522 based on a second threshold voltage ($V_{TP2}$) and a second overdrive voltage ($V_{eff2}$) (e.g., the effective voltage of the of the second transistor device 522). Accordingly, on the second circuit branch 520, a second intermediate voltage corresponding to $0+V_{TP2}+V_{eff2}$ can be generated. Next, as the first and second transistors 512, 522 are the substantially the same size in the particular implementation, both the first and second threshold voltages ($V_{TP1}$, $V_{TP2}$) and the first and second effective voltages ($V_{eff1}$, $V_{eff2}$) (i.e., first and second overdrive voltages) would be substantially identical ($V_{TP1}=V_{TP2}$) ($V_{eff1}=V_{eff2}$). Accordingly, the voltage-level shifters on both the first and the second branches 510, 520 would cancel out. Consequently, the voltage-drop across a voltage offset device 528 (Ry) on the second branch 510 (coupled between to the second transistor 522 and the second node 524) would generate a second offset voltage (i.e., voltage drop, floating voltage). Accordingly, the second voltage ($V_{REF}$) of the circuit 500 may be generated based on a combination of the second intermediate voltage and the generated second offset voltage. In such an implementation, the difference between the output voltages of the first and second voltage offset device (Ry) 528 may be configured to shift down the first voltage ($V_{SENSE}$). Next, at the comparator 530, a comparison of the first and second voltages ($V_{SENSE}$, $V_{REF}$) is performed.

As an example, for the comparison of the first and second voltages ($V_{SENSE}$, $V_{REF}$), similar to FIG. 4, in FIG. 5, the trip point the comparator 530 would occur when $V_{SENSE}-$ $V_{REF}=0$. Also, the circuit 500 would have to verify whether the difference between $V_{SENSE}$ and $V_{REF}$ is substantially equal to the combination of Vin and the difference of the voltage drop across the first voltage offset device (Rx) 518 and the voltage drop across the second voltage offset device (Ry) 528 multiplied by the bias current (IB) (e.g., $V_{SENSE}-V_{REF}=(Rx-Ry)*IB$). Hence at the comparator 530 trip point, $V_{in}=-(Rx-Ry)*IB$. For example, if IB=1 µA and $V_{in}=-0.2V$, then Rx−Ry=200 KΩ. Accordingly, based on the difference of the output voltages of the respective voltage offset devices 518, 528 (Rx, Ry) of each circuit branch 510, 520, a reference voltage may be constructed.

Accordingly, in one case, if $V_{SENSE}$ is a greater than $V_{REF}$ (e.g., when $V_{in}>-0.2V$), the output of the comparator ($V_{COMP}$) 530 corresponds to a first value (e.g., either a digital "1" or "0"), and the example one or more NCP circuits 122 would be configured to decrease voltage ("pump down") and the ring oscillator 118 (as shown in FIG. 1) would be configured to be enabled. Alternatively, in another case, if $V_{SENSE}$ is less than $V_{REF}$ (e.g., when $V_{in}<-0.2V$), the output of the comparator 530 ($V_{COMP}$) corresponds to a second value (e.g., either a digital "0" or "1"), the example one or more NCPs 122 can be configured to stop (i.e., output a zero voltage) and the ring oscillator 118 (as shown in FIG. 1) would be configured to be disabled. This would occur as result of the voltage regulator circuit 500 would having reached the regulated voltage level required to compensate for leakage current (i.e., at the equilibrium voltage level). As discussed, the regulated voltage level (i.e., the output voltage) of the one or more NCPs 122 can be configured to be 200 mV. In such an example, this output voltage (i.e., Neg. $V_{SSWL}$) would be transmitted to each unselected word-line of a respective bit-cell to reduce current leakage.

Figure 6:
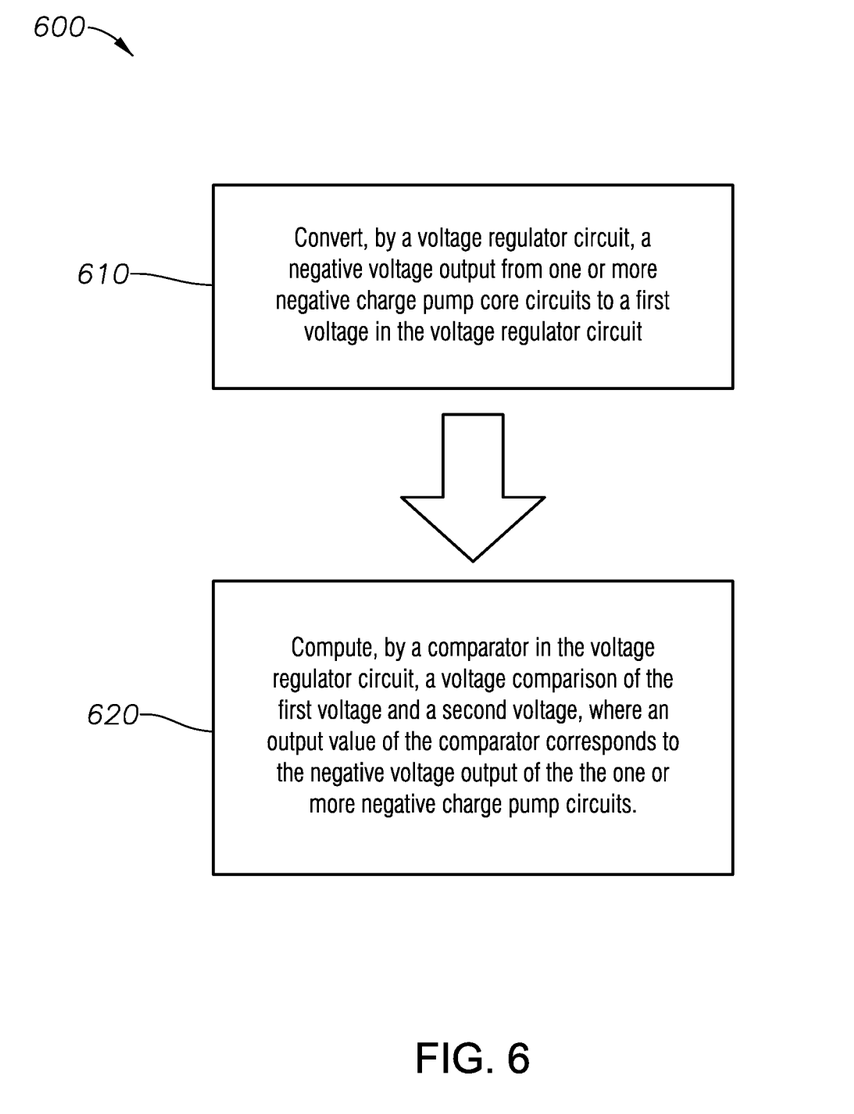
FIG. 6 is a flowchart of a particular illustrative aspect of methods in accordance with various implementations described herein.

Referring to FIG. 6, a method flow chart 600 applicable for the above-mentioned voltage regulators circuits 112, 300, 400, and 500 with reference to FIGS. 1-5 is shown. In certain examples, the method flow chart 600 is applicable for negative voltage to positive voltage conversion for voltage comparison as well as generating a low power reference element (i.e., $V_{REF}$).

At block 610, a negative output voltage from one or more negative charge pump core (NCP) circuits are converted by a voltage regulator circuit to a positive voltage component of a first voltage in the voltage regulator circuit. For example, as shown in FIGS. 1-5, negative output voltage (i.e., Neg. $V_{SSWL}$) from one or more negative charge pump core (NCP) circuits 122 are converted by a voltage regulator circuit (112, 300, 400, 500) to a positive voltage component of a first voltage ($V_{SENSE}$) in the voltage regulator circuit (112, 300, 400, 500).

At block 620, a voltage comparison of the first voltage and a second voltage is performed by a comparator in the voltage regulator circuit. Also, the output value corresponds to the negative voltage output of the negative charge pump circuit. For example, as shown in FIGS. 1-5, a voltage comparison of the first voltage ($V_{SENSE}$) and a second voltage ($V_{REF}$) is performed by a comparator (300, 400, 500) in the voltage regulator circuit (112, 300, 400, 500).

In one implementation of block 610, with reference to FIG. 3, converting the negative voltage comprises: 1) generating the first voltage by a first voltage shift on a first transistor of a first circuit branch of the voltage regulator circuit based on the input voltage, a first threshold voltage, and a first overdrive voltage, and 2) generating the second voltage by a second voltage shift on a second transistor of a second circuit branch based on a second threshold voltage and a second overdrive voltage.

In a second implementation of block 610, with reference to FIG. 4, converting the negative voltage comprises: 1) generating an intermediate voltage based on a first voltage shift on a first transistor of a first circuit branch of the voltage regulator circuit based on the input voltage, a first threshold voltage, and a first overdrive voltage; 2) generating an offset voltage of a voltage offset device coupled to the first transistor; 3) generating the first voltage based on a combination of the intermediate voltage and the offset voltage of the voltage offset device, wherein the voltage offset device is configured to shift down the first voltage; and 4) generating the second voltage based on the first voltage shift.

In a third implementation of block 610, with reference to FIG. 5, converting the negative voltage comprises: 1) generating a first intermediate voltage based on a first voltage shift on a first transistor of a first circuit branch of the voltage regulator circuit based on the input voltage, a first threshold voltage, and a first overdrive voltage; 2) generating a first offset voltage of a first voltage offset device coupled to the first transistor; 3) generating the first voltage based on a combination of the intermediate voltage and the offset voltage of the voltage offset device; 4) generating a second intermediate voltage based on the first voltage shift; 5) generating a second offset voltage of a second voltage offset device coupled to the second transistor; and 6) generating the second voltage based on a combination of the second intermediate voltage and the second offset voltage of the voltage offset device.

Figure 7:
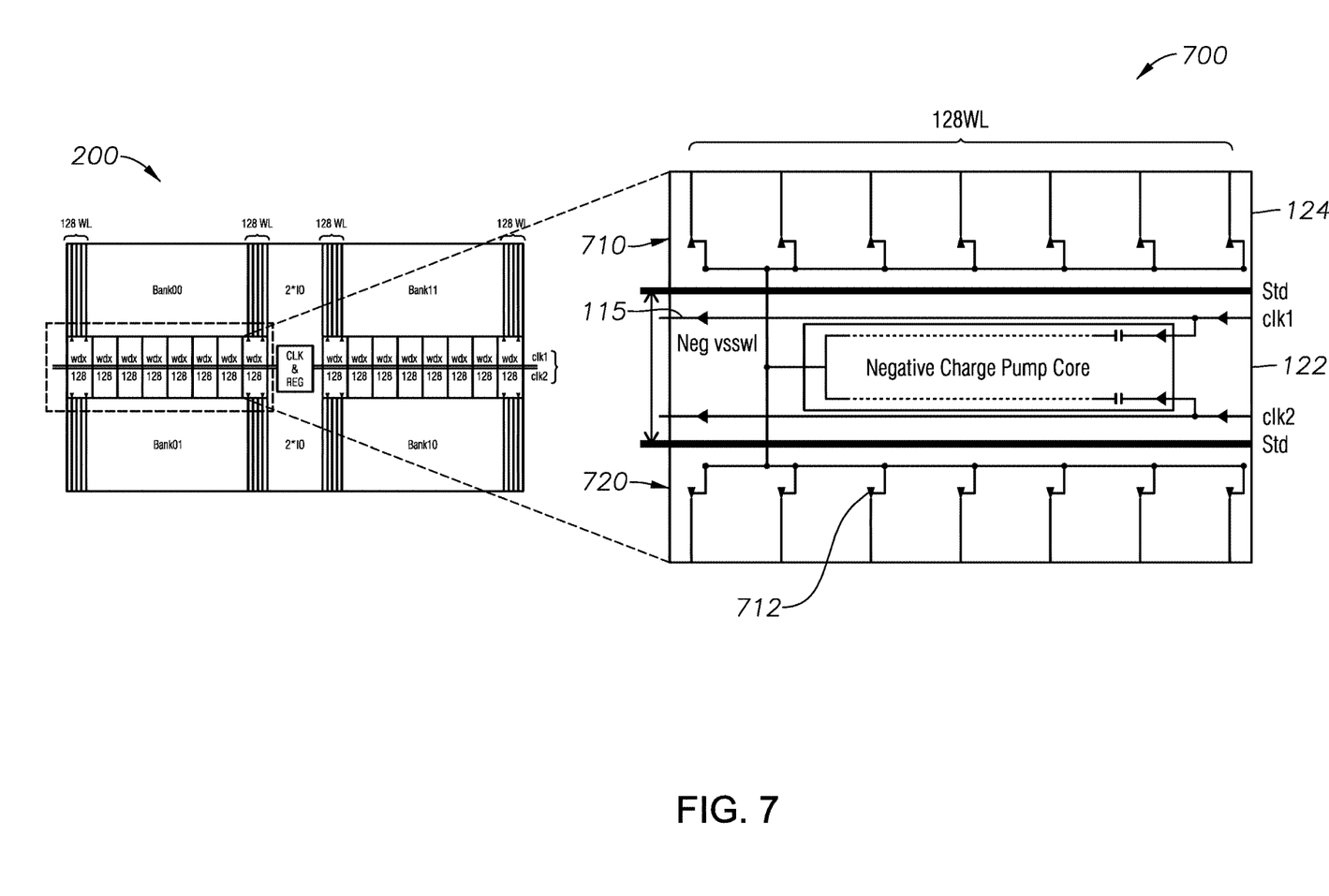
FIG. 7 is a schematic diagram of negative charge pump core circuitry in accordance with various implementations described herein.
Figure 8:
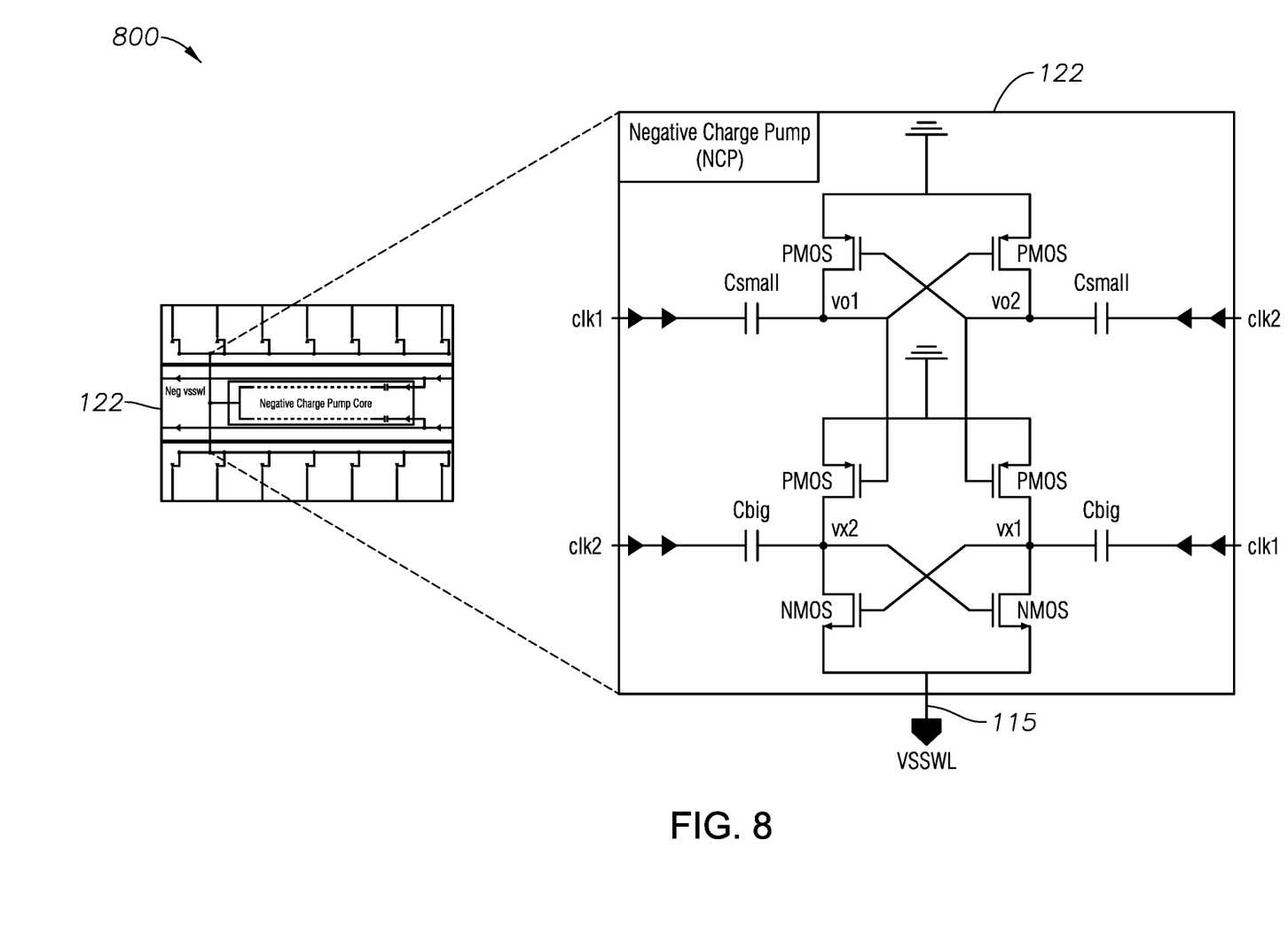
FIG. 8 is a schematic diagram of negative charge pump core circuitry in accordance with various implementations described herein.
Figure 9:
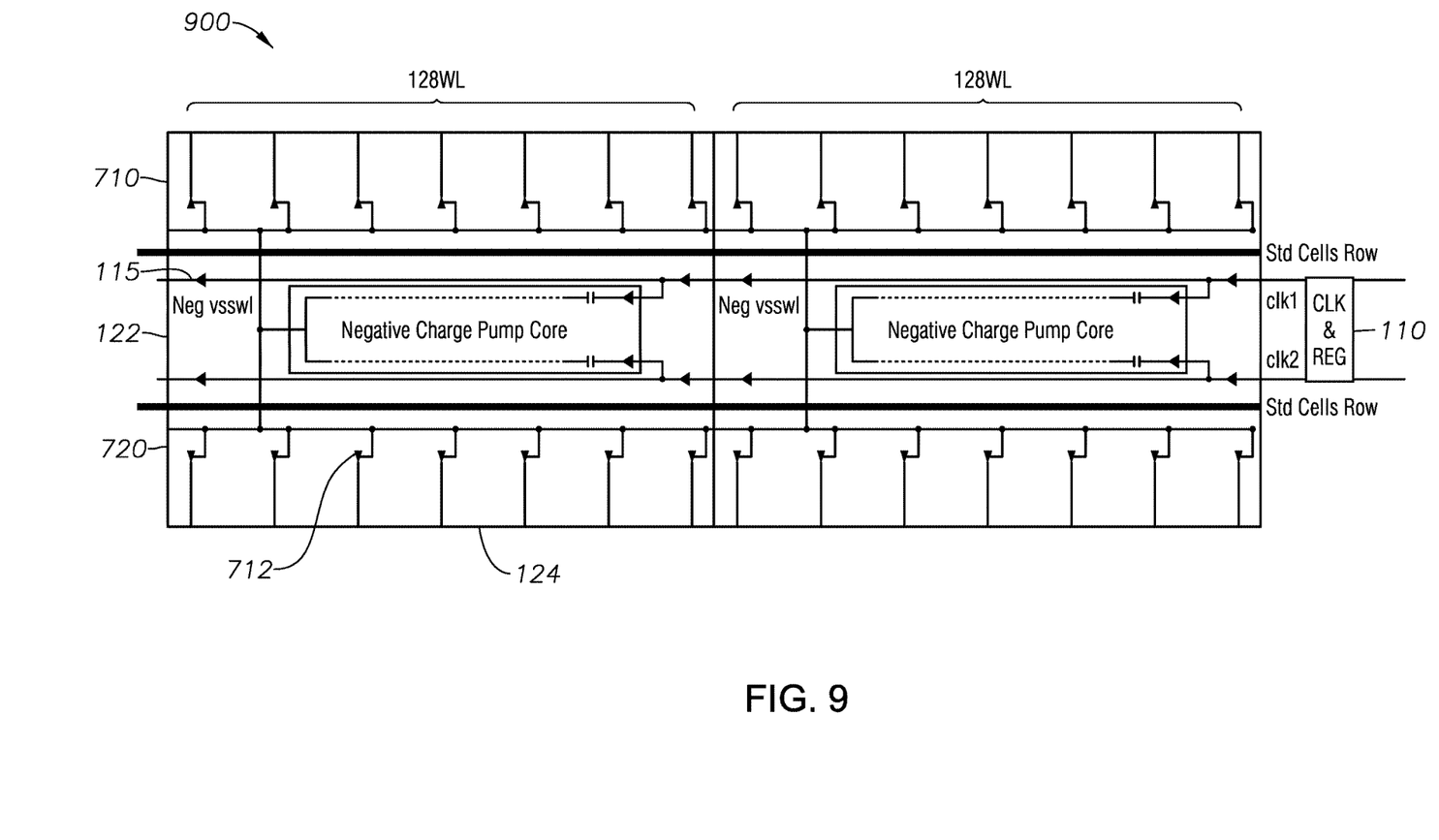
FIG. 9 is a schematic diagram of negative charge pump core circuitry in accordance with various implementations described herein.

Referring to FIG. 7-9, schematic diagrams of the one or more negative charge pump core circuits 122 (i.e., negative charge pumps, NCPs) (is described as NCP(s) 700) are shown. FIG. 7 illustrates an expanded view of an example NCP 122. As shown, the example NCP 122 may be implemented inside each WL decoding block 124 (e.g., WDX128). In certain implementations, the negative output voltage (Neg. $V_{SSWL}$) can be connected to all individual WL drivers 712 (on both the top and bottom). As depicted, the example NCP 700 is integrated within each word-line (WL) decoding block 124 of a plurality of WL decoding blocks 124 in the circuit arrangement 200. As shown in FIGS. 7-9, each of the WL decoding blocks 124 (e.g., WDX128) may include 128 separate WL drivers 712 for a top side 710 and a bottom side 720. FIG. 8 illustrates the circuit architecture of the example NCP 122. As shown, the example NCP 122 may include capacitors and a switch network triggered by clocks (e.g., clk1, clk2 (i.e., two non-overlapping clocks) to generate a negative voltage from lower voltage (e.g., power supply) by charging and discharging the capacitors. As depicted, for greater efficiency, the example NCP 122 architecture may include a cross-coupled topology. FIG. 9 illustrates that at the input of each WL decoding block, the clock phases clk1 and clk2 can be buffered, and that the output voltage (e.g., Neg. $V_{SSWL}$) of each decoding block can be coupled together.

As shown in FIGS. 7-9, a distributed architecture for the one or more negative charge pumps (NCPs) is shown. Advantageously, a minimally-sized NCP core 122 can be implemented inside each WL decoding block 124 (i.e., WDX128). For instance, a minimally-sized NCP core 122 can drive all of the WL drivers of each WL decoding block. Moreover, the output of all of the minimally-sized NCP cores 122 can be connected together to a common node (e.g., having the generated negative voltage, Neg. $V_{SSWL}$). As a result, the total load connected to the node (having the generated negative voltage) may allow for scalability with respect to greater quantities of connected word-lines.

Figure 10:
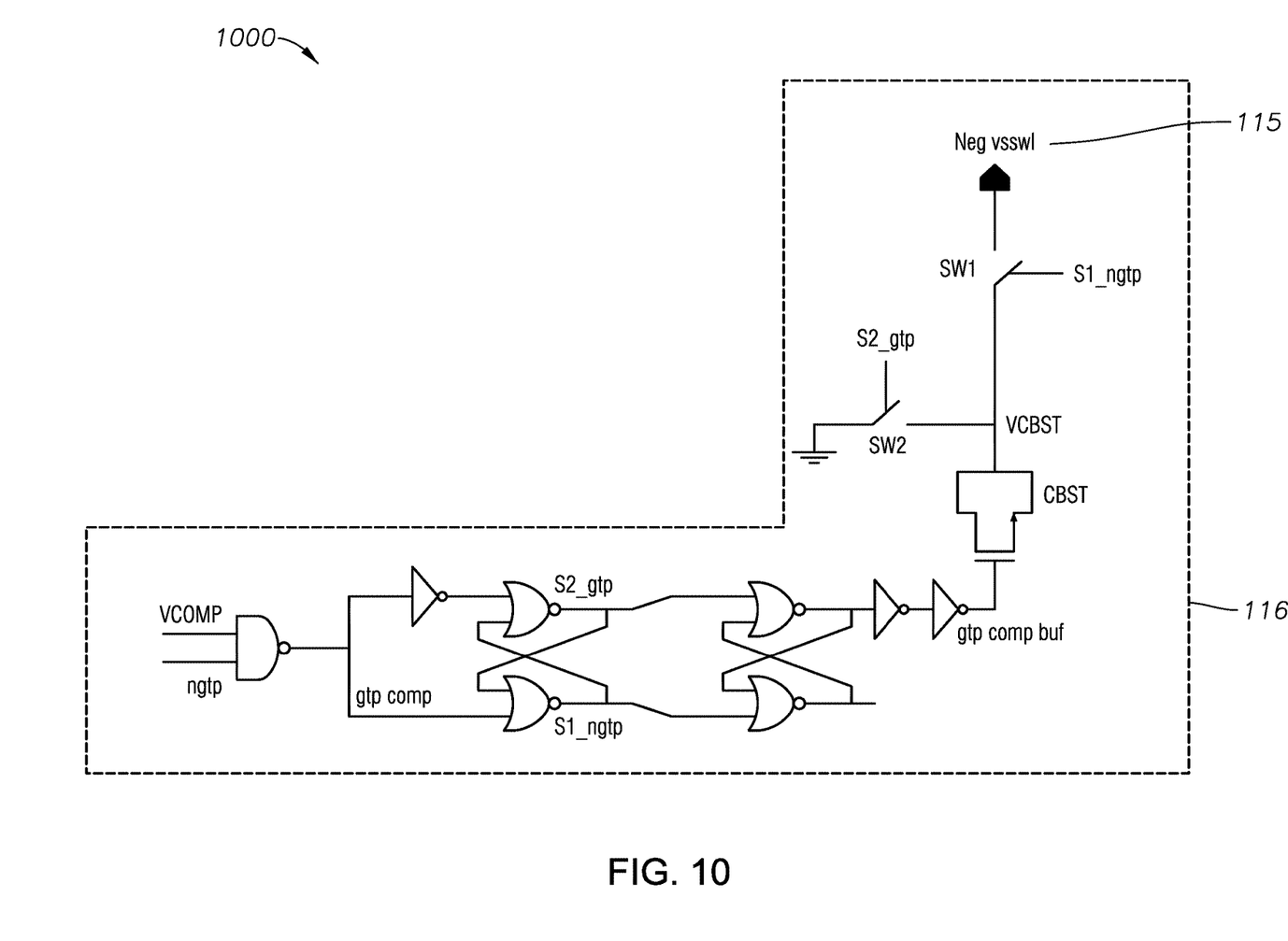
FIG. 10 is a schematic diagram of direct current drift compensation circuitry in accordance with various implementations described herein.

Referring to FIG. 10, a schematic diagram of the DC drift compensation block 116 (i.e., DC drift compensation circuit) (as referenced in FIG. 1) is shown. In an example implementation, the DC drift compensation circuit 116 may be utilized to prevent drift of the voltage output of the one or more NCPs 122. As the one or more NCPs 122 may be sized for a fixed (i.e., given) number of bit-lines (BL) and source-lines (SL), it is likely that the one or more NCPs 122 may not operate as desired. Moreover, during a word-line (WL) deselection, a previously selected WL (at a "high" level, for example, at the power supply) may be discharged to a lower voltage. Hence, positive charges that are stored on such a WL may be injected into the "negative rail" (of the negative voltage output of the one or more NCPs). As a result, the negative voltage (Neg. $V_{SSWL}$) can drift from negative to positive values. Accordingly, to avoid such a drift of the negative voltage, the DC drift compensation circuit 116 can be implemented. As depicted, FIG. 10 illustrates one circuit implementation of the DC compensation block 116.

With reference to FIG. 10, to avoid negative rail DC drift over a certain time duration, the following example operation is presented. At an initial stage of the operation, as $V_{SENSE}>V_{REF}$, the output voltage of the comparator ($VC_{OMP}$)=High. Hence, (as discussed in above paragraphs with reference to the voltage regulator circuit), the one or more NCPs 122 may be enabled and the output voltage 115 (i.e., Neg. $V_{SSWL}$) goes to a negative voltage. Concurrently, the signal ngtp=High. Accordingly, the signal gtp_comp=Low, and the resultant voltages, S2_gtp=Low and S1_ngtp=High. Moreover, the switch SW2 is "off" while the switch SW1 is "on". Thus, capacitor CBST would be coupled to the negative voltage output 115. Next, when the negative voltage output 115 (i.e., Neg. $V_{SSWL}$) may reach the targeted value, $V_{SENSE}<V_{REF}$, thus, making $V_{COMP}$="Low". As a result, the signal gtp_comp="High", the signal S1_ngtp="Low", and the signal S2_gtp="High". Moreover, the switch SW1 would turn "off", while the switch SW2 would turn "on". Hence, the voltage at node VCBST may discharge to ground.

During a WL deselection, the signal ngtp="High". Correspondingly, there would be "charge sharing" between selected (sel) and unselected (unsel) WLs. As a result, the voltage output 115 (Neg. $V_{SSWL}$) increases. Next, as soon as the voltage output 115 crosses the targeted value, $V_{SENSE}>V_{REF}$ and $V_{COMP}$="High". Hence, the signal gtp_comp="Low", and further, the signal S2_gtp="Low" and the signal S1_ngtp="High". Moreover, the switch SW2 would turn "off". while the switch SW1 would turn "on". Thus, the capacitor CB ST would be coupled to the negative voltage output 115. Consequently, the negative voltage output 115 would be "pulled down" again by the capacitor CBST. Furthermore, during a WL selection, the signal ngtp="Low", the signal gtp_comp="High", and further, the signal S1_ngtp="Low" and the signal S2_gtp="High". Moreover, the switch SW1 would turn "off", while the switch SW2 would turn "on". Hence, the voltage at node VCBST may discharge to ground. Accordingly, when the negative voltage output 115 reaches the targeted value, the signal $V_{COMP}$="Low". Over a particular time-interval to prevent a negative rail DC drift, this procedure may be repeated.

Advantageously, while the disclosure has been described in the context of MRAM bit-cells, such implementations, methods, and techniques as described herein may be performed in any other type of memory cells where leakage current prevents accurate memory read operations.

In example implementations, certain circuit elements have been provided in FIGS. 1-10, whose redundant description has not been duplicated in the related description of analogous circuit elements herein. It is expressly incorporated that the same circuit elements with identical symbols and/or reference numerals are included in each of embodiments based on its corresponding figure(s).

Although one or more of FIGS. 1-10 may illustrate systems, apparatuses, or methods according to the teachings of the disclosure, the disclosure is not limited to these illustrated systems, apparatuses, or methods. One or more functions or components of any of FIGS. 1-10 as illustrated or described herein may be combined with one or more other portions of another of FIGS. 1-10. Accordingly, no single implementation described herein should be construed as limiting and implementations of the disclosure may be suitably combined without departing form the teachings of the disclosure.

Those of skill would further appreciate that the various illustrative logical blocks, configurations, modules, circuits, and algorithm steps described in connection with the implementations disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the disclosure herein may be implemented directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description is provided to enable a person skilled in the art to make or use the disclosed implementations. Various modifications to these implementations will be readily apparent to those skilled in the art, and the principles defined herein may be applied to other implementations without departing from the scope of the disclosure. Thus, the present disclosure is not intended to be limited to the implementations shown herein but is to be accorded the widest scope possible consistent with the principles and novel features as defined by the following claims.

What is claimed is:

1. A circuit comprising:
   a first branch comprising a first transistor coupled between a first node and ground, wherein the first branch is configured to generate a first voltage at the first node, wherein the first voltage corresponds to a sensed voltage;
   a second branch comprising a second transistor coupled between a second node and ground, wherein the second branch is configured to generate a second voltage at the second node, wherein the second voltage corresponds to a reference voltage;
   a comparator having a non-inverting input coupled to the first node and an inverting input coupled to the second node, wherein the comparator is configured to generate an output signal based on a comparison between the first voltage at the first node and the second voltage at the second node, wherein the output signal is configured to regulate a charge injection of one or more negative charge pump circuits coupled to the circuit during a word-line deselection; and
   a first voltage offset element coupled to the first transistor and configured to generate an offset voltage to shift the first voltage, wherein:
      the first voltage is generated based on a combination of an intermediate voltage and the offset voltage;
      the intermediate voltage is based on an input voltage of the circuit, a first threshold voltage, and a first overdrive voltage;
      the first voltage offset element is coupled between the first node and the first transistor on the first branch; and
      the first transistor is configured to level shift-up voltage on the first branch based on the input voltage of the circuit, the first threshold voltage, and the first overdrive voltage.

2. The circuit of claim 1, wherein:
   the first branch further comprises a third transistor coupled in series with the first transistor at the first node,
   the second branch further comprises a fourth transistor coupled in series with the second transistor at the second node,
   a gate of the third transistor is coupled to a gate of the fourth transistor,
   the third transistor is configured as a first current source, and
   the fourth transistor is configured as a second current source.

3. The circuit of claim 1, wherein:
   the first and second transistors are configured to receive first and second bias currents on the respective first and second branches,
   the first and second transistors receive the first and second bias currents from a reference current generator circuit coupled to the circuit,
   in response to the first bias current biasing the first transistor, the first branch is further configured to generate the first voltage at the first node, and
   in response to the second bias current biasing the second transistor, the second branch is further configured to generate the second voltage at the second node.

4. The circuit of claim 3, wherein an output voltage of the one or more negative charge pump circuits is configured to be the input voltage of the circuit.

5. The circuit of claim 1, wherein the difference between the first voltage and the second voltage corresponds to a differential input voltage of the circuit.

6. The circuit of claim 1, wherein the second transistor is configured to level shift-up voltage on the second branch based on a second threshold voltage and a second overdrive voltage.

7. The circuit of claim 6, wherein the difference between the first and second overdrive voltages corresponds to a voltage regulation range of the one or more negative charge pump circuits.

8. The circuit of claim 1, wherein the one or more negative charge pump circuits are configured to decrease voltage and wherein a ring oscillator coupled to the circuit is configured to be enabled when the output signal corresponds to a first value.

9. The circuit of claim 1, wherein the one or more negative charge pump circuits are configured to stop and output zero voltage when the output signal corresponds to a second value, and wherein a ring oscillator coupled to the circuit is configured to be disabled.

10. The circuit of claim 1, wherein an output voltage of the one or more negative charge pump circuits is configured to output −200 mV, and wherein the output voltage is configured to be transmitted to each unselected word-line of a respective bit-cell to reduce current leakage.

11. The circuit of claim 1, wherein the second voltage is generated based on the intermediate voltage.

12. The circuit of claim 1, wherein the second branch further comprises a second voltage offset element, wherein the first and the second voltage offset elements are configured to shift down both the respective first and the second voltages.

13. The circuit of claim 1, wherein sizes of the first and second transistors are substantially identical.

14. The circuit of claim 1, wherein in a system comprising the circuit and a direct current drift compensation circuit, the circuit is coupled to the direct current drift compensation circuit, and wherein the direct current drift compensation circuit is configured to prevent drift from negative voltages to positive voltages.

15. The circuit of claim 1, wherein an input voltage of the comparator corresponds to an output voltage of the second branch at the second node.

16. The circuit of claim 15, wherein the second branch further comprises a fourth transistor, wherein a gate of a third transistor is coupled to a gate of the fourth transistor, wherein the third and the fourth transistors are coupled in series with the respective first and the second transistors, wherein the second node is coupled between the fourth transistor and a second current source.

17. A circuit comprising:
   a first branch comprising a first transistor, wherein the first branch is configured to generate a first voltage;
   a second branch comprising a second transistor, wherein the second branch is configured to generate a second voltage; and
   a comparator configured to generate an output signal based on a comparison of the first and second voltages, wherein the output signal is configured to regulate a charge injection of one or more negative charge pump circuits coupled to the circuit during a word-line deselection,
   wherein in a system comprising the circuit and the one or more negative charge pump circuits, the circuit is coupled to a plurality of negative charge pump circuits, wherein each of the plurality of negative charge pump circuits is configured to drive respective word-line decoding portions, and wherein clock phases of the respective word-line decoding portions are buffered, and an output voltage of the respective word-line decoding portions is coupled together in order.

18. A method comprising:

providing a voltage regulator circuit with a first branch and a second branch, the first branch having a first transistor coupled between a first node and ground, and the second branch having a second transistor coupled between a second node and ground;

generating, by the voltage regulator circuit, a first voltage at the first node of the first branch of the voltage regulator circuit, wherein the first voltage corresponds to a sensed voltage;

generating, by the voltage regulator circuit, a second voltage at the second node of the second branch of the voltage regulator circuit, wherein the second voltage corresponds to a reference voltage;

generating, by a comparator of the voltage regulator circuit, an output signal based on a comparison between the first voltage at the first node and the second voltage at the second node, wherein the comparator comprises a non-inverting input coupled to the first node and an inverting input coupled to the second node, and wherein the output signal is configured to regulate a charge injection of one or more negative charge pump circuits coupled to the voltage regulator circuit during a word-line deselection; and generating, by a first voltage offset element of the voltage regulator circuit, an offset voltage to shift the first voltage, wherein:
the first voltage is generated based on a combination of an intermediate voltage and the offset voltage;
the intermediate voltage is based on an input voltage, a first threshold voltage, and a first overdrive voltage;
the first voltage offset element is coupled between the first node and the first transistor on the first branch; and
the first transistor is configured to level shift-up voltage on the first branch based on the input voltage, the first threshold voltage, and the first overdrive voltage.

19. The method of claim 18, wherein:
the first branch comprises a third transistor coupled in series with the first transistor at the first node,
the second branch comprises a fourth transistor coupled in series with the second transistor at the second node,
a gate of the third transistor is coupled to a gate of the fourth transistor,
the third transistor is configured as a first current source, and
the fourth transistor is configured as a second current source.

20. The method of claim 18, further comprising:
receiving, by the first and second transistors, first and second bias currents on the respective first and second branches;
receiving, by the first and second transistors, the first and second bias currents from a reference current generator circuit coupled to the voltage regulator circuit;
in response to the first bias current biasing the first transistor, generating, by the first branch, the first voltage at the first node, and
in response to the second bias current biasing the second transistor, generating, by the second branch, the second voltage at the second node.

21. The method of claim 18, wherein the second transistor is configured to level shift-up voltage on the second branch based on a second threshold voltage and a second overdrive voltage.

22. The method of claim 21, wherein the difference between the first and second overdrive voltages corresponds to a voltage regulation range of the one or more negative charge pump circuits.

23. The method of claim 18, wherein the second branch comprises a second voltage offset element, wherein the first and the second voltage offset elements are configured to shift down both the respective first and the second voltages.

* * * * *